United States Patent [19]

Tseng

[11] Patent Number: 5,759,895
[45] Date of Patent: Jun. 2, 1998

[54] METHOD OF FABRICATING A CAPACITOR STORAGE NODE HAVING A RUGGED-FIN SURFACE

[75] Inventor: Horng-Huei Tseng, Hsinchu, Taiwan

[73] Assignee: Vanguard International Semiconductor Company, Hsin-Chu, Taiwan

[21] Appl. No.: 949,469

[22] Filed: Oct. 14, 1997

[51] Int. Cl.⁶ .................. H01L 21/8242; H01L 21/20
[52] U.S. Cl. ............................. 438/255; 438/398
[58] Field of Search ..................... 438/238, 239, 438/240, 253–255, 381, 396–398; 257/306, 309, 310

[56] References Cited

U.S. PATENT DOCUMENTS

| | | | |
|---|---|---|---|
| 5,340,763 | 8/1994 | Dennison | 437/52 |
| 5,444,013 | 8/1995 | Akram et al. | 437/60 |
| 5,478,769 | 12/1995 | Lim | 438/255 |
| 5,567,640 | 10/1996 | Tseng | 437/52 |
| 5,597,756 | 1/1997 | Fazan et al. | 437/52 |
| 5,639,689 | 6/1997 | Woo | 438/398 |

*Primary Examiner*—Joni Chang
*Attorney, Agent, or Firm*—George O. Saile; Stephen B. Ackerman; Larry J. Prescott

[57] ABSTRACT

A method of forming a high capacitance capacitor which does not require additional integrated circuit chip surface area. A capacitor storage electrode or first capacitor plate is formed from amorphous silicon and attached to a polysilicon stud. Dielectric is removed from the under side of the first capacitor plate. The amorphous silicon is then annealed at low pressure to form hemispherical grain polysilicon on the surface of the amorphous silicon thereby increasing the surface area. In one embodiment polysilicon spacers are used to increase the first capacitor plate surface area. The first capacitor plate is then covered by a conformal dielectric layer and a polysilicon second capacitor plate is formed. The capacitor extends over the active integrated circuit chip area but is above the surface of the chip and thereby does not use additional chip area.

20 Claims, 7 Drawing Sheets

METHOD OF FABRICATING A CAPACITOR STORAGE NODE HAVING A RUGGED-FIN SURFACE

BACKGROUND OF THE INVENTION (1) Field of the Invention

This invention relates to a method of forming a capacitor plate for a high capacitance capacitor and more specifically to a capacitor plate formed from amorphous silicon which is roughened using a low pressure annealing step to increase surface area.

(2) Description of the Related Art

U.S. Pat. No. 5,444,013 to Akram et al. describes a method of forming a capacitor by forming a depression in a silicon substrate and forming hemispherical grain polysilicon in the depression.

U.S. Pat. No. 5,340,763 to Dennison describes forming a polysilicon pin type structure and forming hemispherical grain polysilicon on the polysilicon pins. The pins with hemispherical grain polysilicon form the storage node of a capacitor.

U.S. Pat. No. 5,567,640 to Tseng shows the formation of a T-shaped capacitor plate, but does not describe the use of hemispherical grain polysilicon.

U.S. Pat. No. 5,597,756 to Fazan et al. describes the formation of a cup shaped capacitor plate with hemispherical grain polysilicon formed on the inner and outer surfaces of the cup.

This invention describes a method of forming a storage node of a capacitor by forming an amorphous silicon plate on a polysilicon stud. The amorphous silicon plate is then covered with hemispherical grain polysilicon. In one embodiment polysilicon spacers are used to increase the surface area of the storage node of the capacitor.

SUMMARY OF THE INVENTION

Capacitors having sufficient storage capacity are important in integrated circuit applications, particularly in the application of dynamic random access memory, DRAM, applications. With limited real estate available on the integrated circuit chip for each DRAM circuit, particularly as ship sizes become smaller and smaller, finding space for a capacitor with sufficient capacitance becomes increasingly difficult.

It is a principle objective of this invention to provide methods of forming a capacitor storage node providing large capacitance while using a small part of the chip surface area.

This objective is achieved by forming a layer of dielectric over the integrated circuit chip. A contact hole is formed in the layer of dielectric and a polysilicon stud is formed in the contact hole. An amorphous silicon plate is then formed on the top of the polysilicon stud. Part of the layer of dielectric is then etched away exposing the bottom as well as the top of the amorphous silicon plate. The amorphous silicon plate is then subjected to a low pressure anneal thereby forming hemispherical grain polysilicon on the surface of the amorphous silicon plate and increasing the surface area of the plate thereby forming a capacitor storage node with increased surface area. A conformal dielectric coating is then formed over the storage electrode and a polysilicon second capacitor plate is formed over the conformal dielectric coating. The polysilicon second capacitor plate is then patterned and contacts to the second capacitor plate are formed.

The capacitor formed in this way has increased capacitance because of the irregular surface provided by the hemispherical grain polysilicon and the fact that both sides of the amorphous silicon plate can be used for the capacitor storage electrode.

DESCRIPTION OF THE PREFERRED EMBODIMENTS

Figure 1:
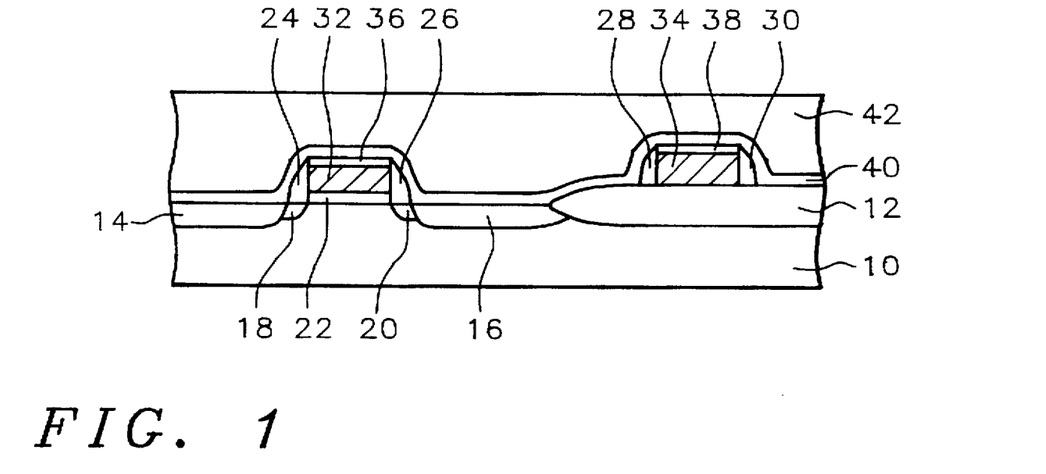
FIG. 1 shows a cross section view of a part of an integrated circuit wafer showing the first dielectric layer formed on the wafer.

Refer now to FIGS. 1–14 for a detailed description of the preferred embodiments of the method of forming a high capacitance capacitor of this invention. FIG. 1 shows a cross section view of a part of an integrated circuit wafer 10 having devices formed therein. FIG. 1 shows a drain 14, source 16, lightly doped drain region 18, lightly doped source region 20, and a field oxide isolation region 12 formed in the wafer 10. A gate oxide 22 is formed on the wafer and a polysilicon gate electrode 32 is formed over the gate oxide 22. A cap oxide 36 is formed over the gate electrode 32 and oxide spacers 24 and 26 are formed on the sidewalls of the gate electrode 32. A polysilicon word line electrode 34 is formed on the field oxide isolation region 12. A cap oxide 38 is formed over the word line electrode 34 and oxide spacers 28 and 30 are formed on the sidewalls of the word line electrode 34.

A first dielectric layer 42, which can be either a doped or undoped dielectric, is formed over the wafer. If the first dielectric layer 42 is doped dielectric a base layer of undoped dielectric 40, such as silicon dioxide deposited using chemical vapor deposition and having a thickness of between about 1000 and 2000 Angstroms, is deposited under the first dielectric layer 42 covering the gate electrode 32 and word line electrode 34. If the first dielectric layer 42 is undoped dielectric the base layer of undoped dielectric 40 is not required and not used. In this example the first dielectric layer 42 can be a doped oxide such as borophosphosilicate glass having a thickness of between about 3000 and 8000 Angstroms or an undoped oxide such as silicon dioxide deposited using chemical vapor deposition and having a thickness of between about 3000 and 8000 Angstroms.

Figure 2:
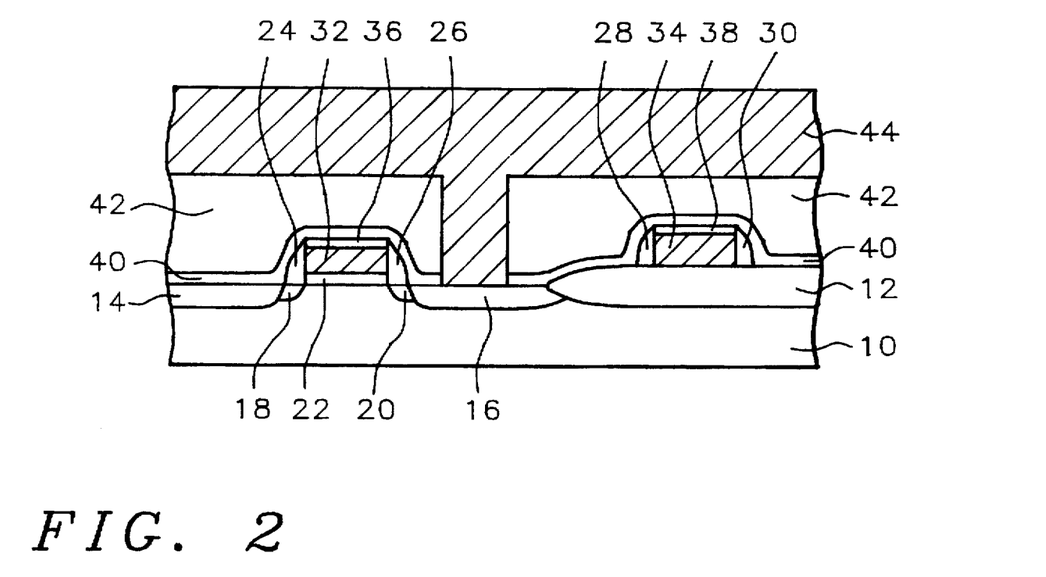
FIG. 2 shows a cross section view of the part of the integrated circuit wafer of FIG. 1 showing a blanket layer of polysilicon over the wafer filing a via hole formed in the first dielectric layer.
Figure 3:
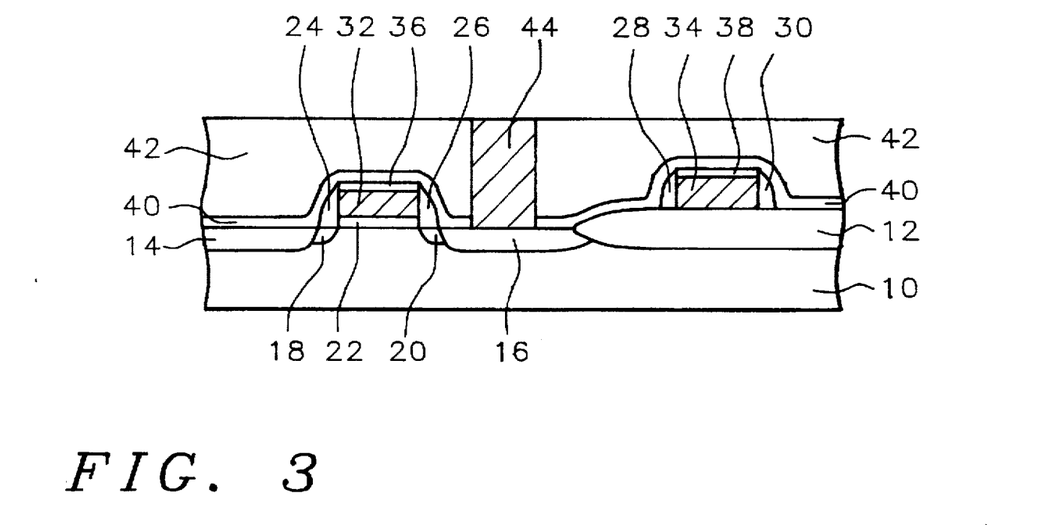
FIG. 3 shows a cross section view of the part of the integrated circuit wafer of FIG. 2 showing the polysilicon above the surface of the first dielectric layer removed, leaving a polysilicon.
Figure 4:
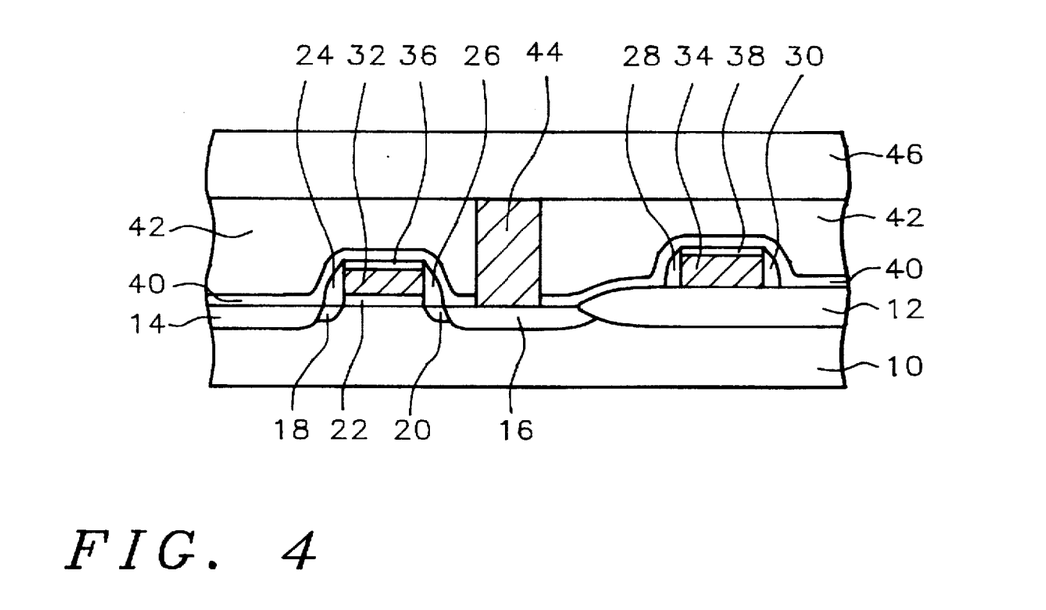
FIG. 4 shows a cross section view of the part of the integrated circuit wafer of FIG. 3 showing a layer of amorphous silicon formed over the first dielectric layer.

A via hole is then etched in the first dielectric layer 42 and base layer of undoped oxide 40, if used, exposing a contact region in the source 16, see FIG. 2. Next, as shown in FIG. 2, a first layer of polysilicon 44 is blanket deposited over the wafer filling the via hole. Next, as shown in FIG. 3, that part of the first polysilicon layer above the first dielectric layer 42 is removed, using means such as chemical mechanical polishing or plasma etchback, leaving a polysilicon stud 44 in contact with the source 16. If chemical mechanical polishing is used the first dielectric layer 42 is undoped and the base layer of undoped oxide 40 is not used. A layer of amorphous silicon 46 having a thickness of between about 100 and 1000 Angstroms is then deposited on the wafer using means such as low pressure chemical vapor deposition of silane gas at a temperature of between about 540° C. and 560° C. The preferred embodiments of the method of forming a capacitor of this invention are the same through this step of the fabrication of the capacitor.

Figure 5:
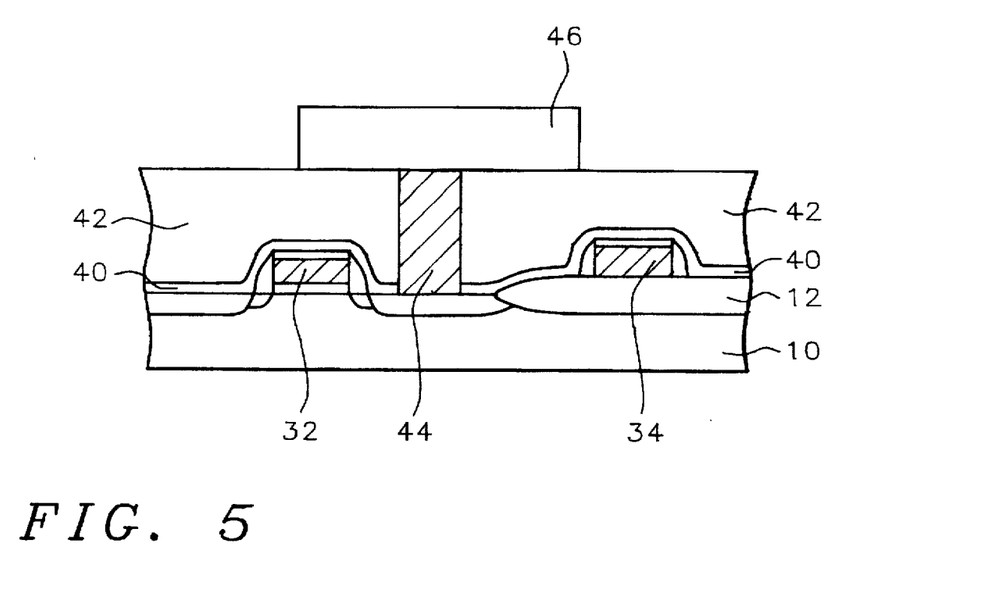
FIG. 5 shows a cross section view of the part of the integrated circuit wafer of FIG. 4 showing the layer of amorphous silicon patterned to form an amorphous silicon plate.
Figure 6:
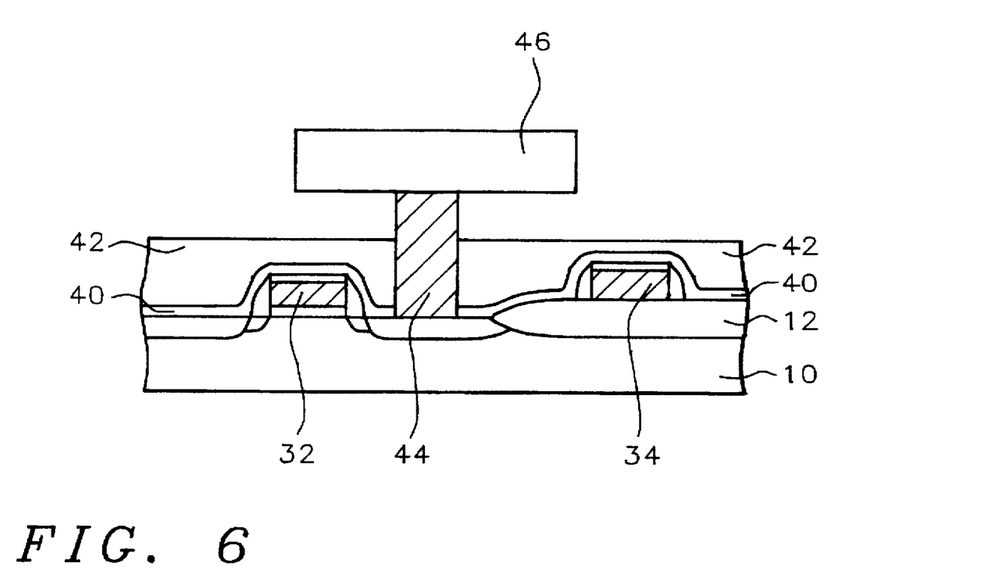
FIG. 6 shows a cross section view of the part of the integrated circuit wafer of FIG. 5 after part of the first dielectric layer has been etched away exposing the bottom surface of the amorphous silicon plate.

Refer now to FIGS. 5–8 to continue the description of the first embodiment of the method of this invention. As shown in FIG. 5, the layer of amorphous silicon is then patterned to form an amorphous silicon plate 46 using patterned photoresist and etching, such as plasma etching. Next, as shown in FIG. 6, a part of the first dielectric layer 42 is etched away so that all first dielectric 42 is removed from the bottom of the amorphous silicon plate 46 leaving the amorphous silicon plate 46 attached to the polysilicon stud 44. This etching of a part of the first dielectric layer uses wet hydrofluric acid HF or a dry plasma etch using $CHF_3$.

Figure 7:
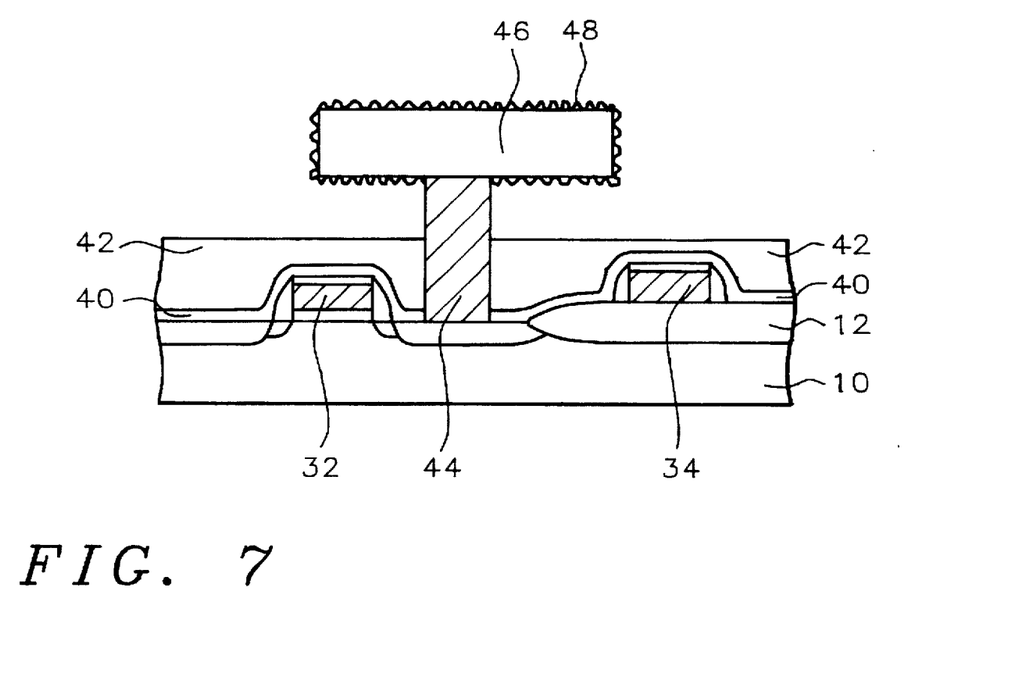
FIG. 7 shows a cross section view of the part of the integrated circuit wafer of FIG. 6 after low pressure annealing of the amorphous silicon plate.
Figure 8:
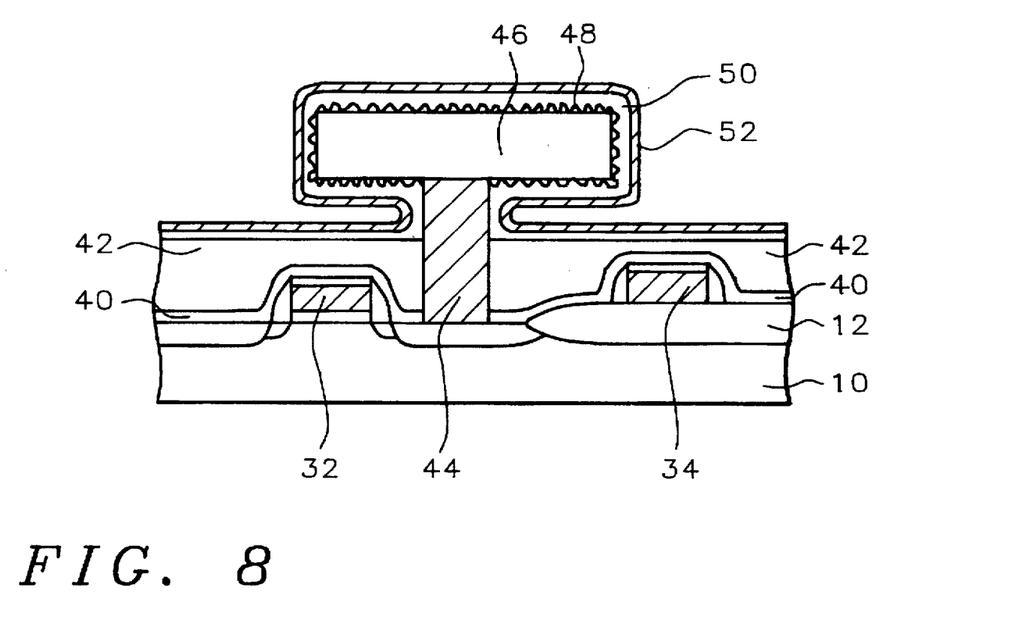
FIG. 8 shows a cross section view of the part of the integrated circuit wafer of FIG. 7 showing the conformal second dielectric layer and the polysilicon capacitor electrode.

Next, as shown in FIG. 7, the amorphous silicon plate 46 is annealed at a temperature of between about 550° C. and 650° C. and a pressure of less than $1 \times 10^{-6}$ torr thereby forming hemispherical grain polysilicon on the surface of the amorphous silicon which increases the surface area and forms a capacitor storage node or first capacitor plate 46. As shown in FIG. 8 a conformal layer of second dielectric 50 is then formed on the wafer completely covering the first capacitor plate 46. In this example the second dielectric 50 is NO, ONO, or $Ta_2O_5$ deposited using chemical vapor deposition and having a thickness of between about 10 and 150 Angstroms. Next a second layer of polysilicon 52 having a thickness of between about 1000 and 2000 Angstroms is deposited to form the second capacitor plate. The second layer of polysilicon 52 and the second dielectric 50 are then patterned to complete the capacitor.

Figure 9:
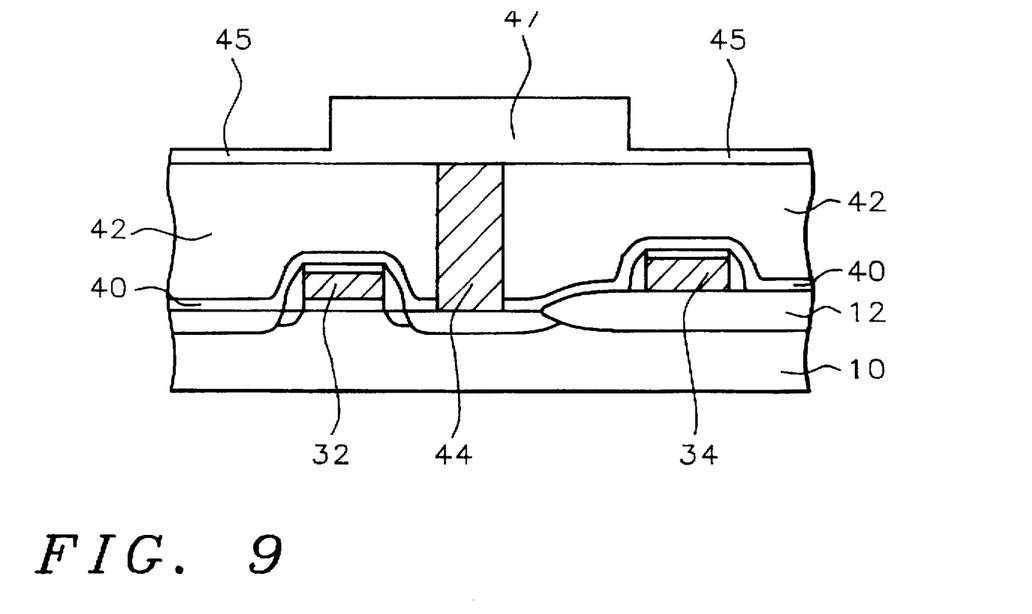
FIG. 9 shows a cross section view of the part of the integrated circuit wafer of FIG. 4 showing the amorphous silicon layer patterned to form an amorphous silicon plate and a thin layer of amorphous silicon over that part of the first dielectric layer not covered by the amorphous silicon plate.
Figure 10:
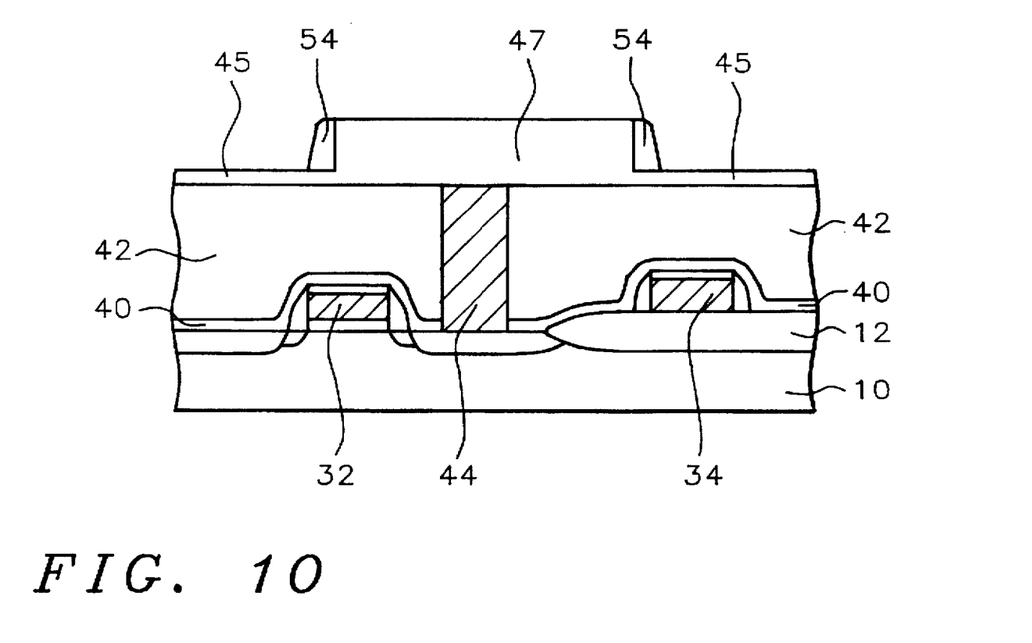
FIG. 10 shows a cross section view of the part of the integrated circuit wafer of FIG. 9 after forming dielectric spacers at the sidewalls of the amorphous silicon plate.

Refer now to FIGS. 1–4 and 9–14 for another embodiment of the method of this invention. As shown in FIGS. 1–4, this embodiment proceeds exactly like the preceding embodiment through the step of depositing a layer of amorphous silicon 46 on the wafer. Next, as shown in FIG. 9 part of the amorphous silicon layer is etched away using patterned photoresist and etching, such as plasma etching, leaving a thick region 47, having sidewalls, and a thin region 45 of the amorphous silicon layer. Next, as shown in FIG. 10, dielectric spacers 54 are formed on the sidewalls of the thick region 47 of the amorphous silicon layer. In this example the dielectric spacers are silicon dioxide and are formed using standard techniques for forming spacers.

Figure 11:
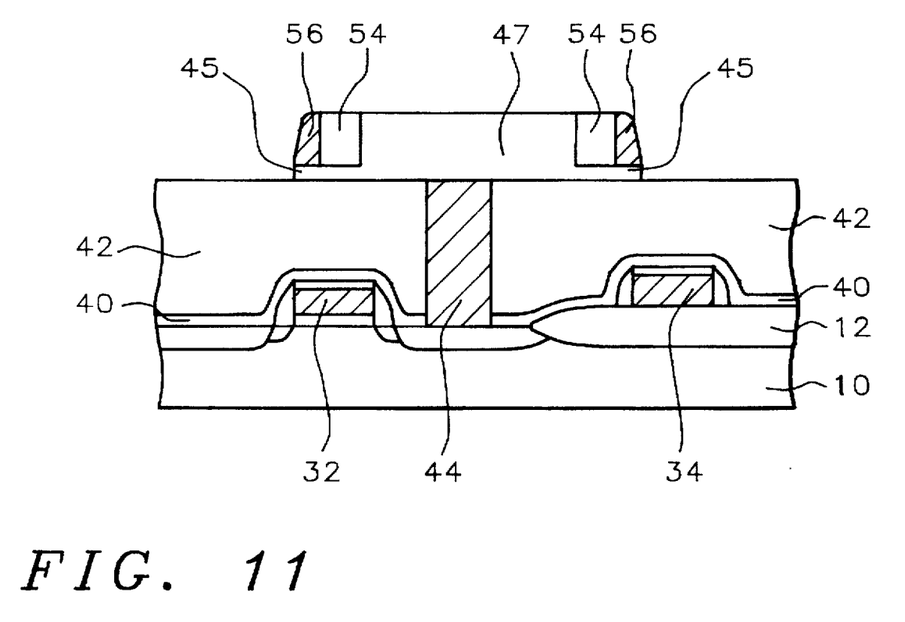
FIG. 11 shows a cross section view of the part of the integrated circuit wafer of FIG. 10 showing polysilicon spacers formed next to the dielectric spacers.
Figure 12:
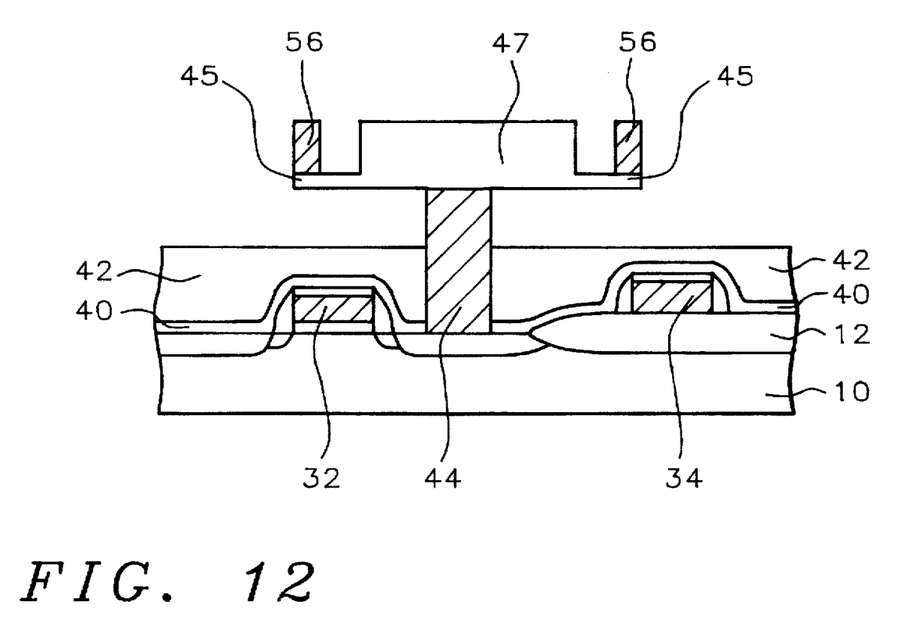
FIG. 12 shows a cross section view of the part of the integrated circuit wafer of FIG. 11 after the dielectric spacers and part of the first dielectric layer have been etched away exposing the bottom surface of the amorphous silicon plate.

Next, as shown in FIG. 11, polysilicon spacers 56 are formed adjacent to the dielectric spacers 54 using standard techniques for forming polysilicon spacers which includes a dry isotropic etching step. During this dry isotropic etching step that part of the thin amorphous silicon layer 45 not covered by the dielectric spacers 54 or the polysilicon spacers 56 is etched away. Next as shown in FIG. 12 the dielectric spacers and a part of the first dielectric layer 42 is etched away, using wet HF or dry $CHF_3$, so that all first dielectric 42 is removed from the bottom of the amorphous silicon plate 47 and the remaining part of the thin amorphous silicon 45 leaving the amorphous silicon plate 47 attached to the polysilicon stud 44.

Figure 13:
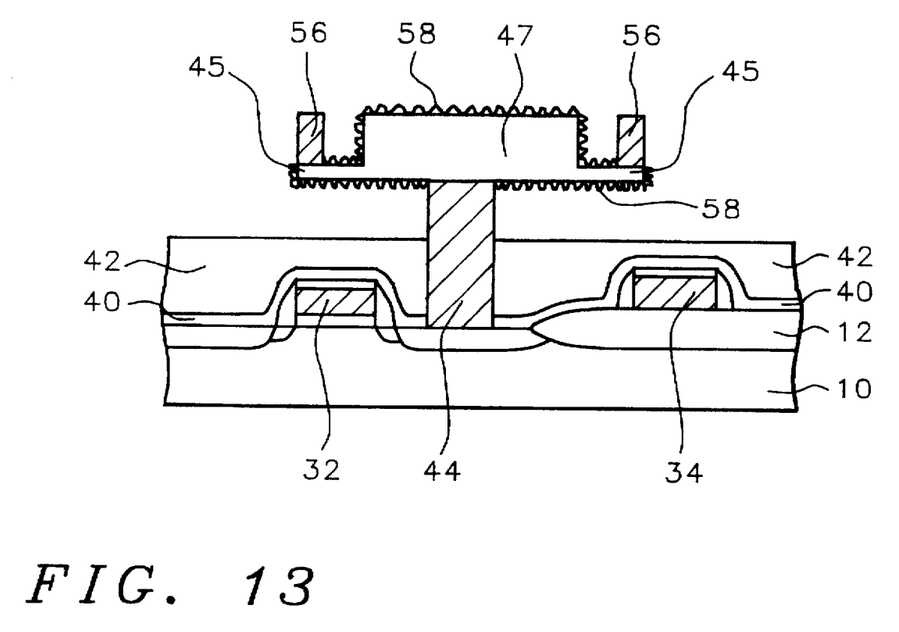
FIG. 13 shows a cross section view of the part of the integrated circuit wafer of FIG. 12 after low pressure annealing of the amorphous silicon plate.
Figure 14:
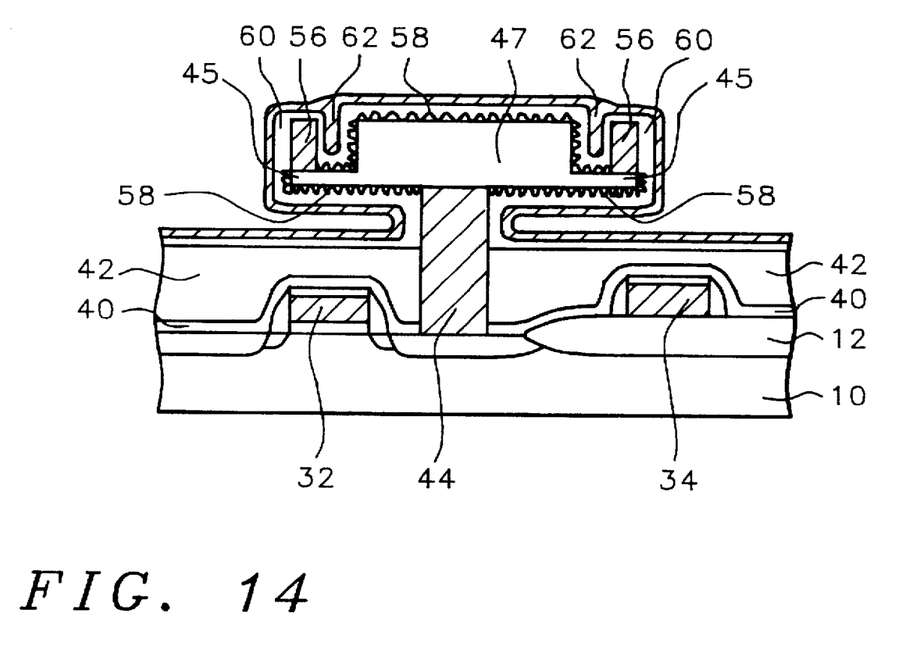
FIG. 14 shows a cross section view of the part of the integrated circuit wafer of FIG. 13 showing the conformal second dielectric layer and the polysilicon capacitor electrode.

Next, as shown in FIG. 13, the amorphous silicon plate 47 and the remaining part of the thin amorphous silicon 45 is annealed at a temperature of between about 550° C. and 650° C. and a pressure of less than $1 \times 10^{-6}$ torr thereby forming hemispherical grain polysilicon on the surface of the amorphous silicon which increases the surface area. The hemispherical grain polysilicon on the surface of the amorphous silicon plate 47 and the thin amorphous silicon 45, and the polysilicon spacers 56 form a capacitor storage node or first capacitor plate. Then, as shown in FIG. 14, a conformal layer of second dielectric 60 is then formed on the wafer completely covering the first capacitor plate 47. In this example the second dielectric 60 is NO, ONO, or $Ta_2O_5$ deposited using chemical vapor deposition and having a thickness of between about 10 and 150 Angstroms. Next a second layer of polysilicon 62 having a thickness of between about 1000 and 2000 Angstroms is deposited to form the second capacitor plate. The second layer of polysilicon 62 and the second dielectric 60 are then patterned to complete the capacitor.

In these embodiments the shape of the first capacitor plate, the hemispherical grain polysilicon surface, and, when used, the polysilicon spacers form a capacitor storage electrode having high surface area without using additional chip surface area.

While the invention has been particularly shown and described with reference to the preferred embodiments thereof, it will be understood by those skilled in the art that various changes in form and details may be made without departing from the spirit and scope of the invention.

What is claimed is:

1. A method of fabricating a capacitor, comprising the steps of:

providing an integrated circuit wafer having devices formed therein and electrodes and contact regions formed thereon;

forming a first dielectric layer having a top surface over said integrated circuit wafer;

forming a contact hole in said first dielectric layer directly over one of said contact regions;

depositing a layer of first polysilicon on said integrated circuit wafer thereby filling said contact hole with said first polysilicon;

removing a part of said layer of first polysilicon above said top surface of said first dielectric layer thereby leaving said first polysilicon in said contact hole forming a first polysilicon stud;

depositing a layer of amorphous silicon on said top surface of said first dielectric layer after forming said first polysilicon stud;

patterning said layer of amorphous silicon thereby forming an amorphous silicon plate wherein said amorphous silicon plate covers said first polysilicon stud;

removing said top surface of said first dielectric layer and a part of said first dielectric layer within a first thickness of said top surface of said first dielectric layer after patterning said layer of amorphous silicon so that no part of said first dielectric layer contacts said amorphous silicon plate;

annealing said amorphous silicon plate thereby forming hemispherical grain polysilicon on a surface of said amorphous silicon plate wherein said hemispherical grain polysilicon on said surface of said amorphous silicon plate forms a first capacitor plate;

depositing a conformal layer of second dielectric over said first capacitor plate;

depositing a layer of second polysilicon over said conformal layer of second dielectric; and patterning said conformal layer of second dielectric and said layer of second polysilicon thereby forming a second capacitor plate.

2. The method of claim 1 wherein said first dielectric layer is borophosphosilicate glass having a thickness of between about 3000 and 8000 Angstroms.

3. The method of claim 1 wherein said first dielectric layer is undoped silicon dioxide having a thickness of between about 3000 and 8000 Angstroms.

4. The method of claim 1 wherein said removing said part of said layer of first polysilicon above said top surface of said first dielectric layer is accomplished using plasma etchback.

5. The method of claim 1 wherein said removing said part of said layer of first polysilicon above said top surface of said first dielectric layer is accomplished using chemical mechanical polishing and said first dielectric layer is undoped silicon oxide having a thickness of between 3000 and 8000 Angstroms.

6. The method of claim 1 wherein said depositing said layer of amorphous silicon is accomplished using low pressure chemical vapor deposition of silane gas at a temperature of between about 540° C. and 560° C.

7. The method of claim 1 wherein said removing said top surface of said dielectric layer and said part of said first dielectric layer within said first thickness of said top surface of said first dielectric layer is accomplished by means of wet etching using hydrofluoric acid.

8. The method of claim 1 wherein said removing said top surface of said dielectric layer and said part of said first dielectric layer within said first thickness of said top surface of said first dielectric layer is accomplished by means of dry plasma etching using $CHF_3$.

9. The method of claim 1 wherein said annealing said amorphous silicon plate is performed at a temperature of between about 550° C. and 650° C. and a pressure of less than $1 \times 10^{-6}$ torr.

10. The method of claim 1 wherein said conformal layer of second dielectric is NO, ONO, or $Ta_2O_5$.

11. A method of fabricating a capacitor, comprising the steps of:

providing an integrated circuit wafer having devices formed therein and electrodes and contact regions formed thereon;

forming a first dielectric layer having a top surface over said integrated circuit wafer;

forming a contact hole in said first dielectric layer directly over one of said contact regions;

depositing a layer of first polysilicon on said integrated circuit wafer thereby filling said contact hole with said first polysilicon;

removing a part of said layer of first polysilicon above said top surface of said first dielectric layer thereby leaving said first polysilicon in said contact hole forming a first polysilicon stud;

depositing a layer of amorphous silicon on said top surface of said first dielectric layer after forming said first polysilicon stud;

patterning said layer of amorphous silicon thereby forming an amorphous silicon plate having sidewalls and a first thickness of amorphous silicon on a part of said top surface of said first dielectric layer which is not covered by said amorphous silicon plate wherein said amorphous silicon plate covers said first polysilicon stud;

forming dielectric spacers having inner walls and outer walls at said sidewalls of said amorphous silicon plate wherein said inner walls of said dielectric spacers contact said sidewalls of said amorphous silicon plate;

forming doped polysilicon spacers at said outer walls of said dielectric spacers;

removing a part of said first thickness of amorphous silicon formed on said part of said top surface of said first dielectric layer which is not covered by said amorphous silicon plate which is not covered by said dielectric spacers or said polysilicon spacers;

removing said dielectric spacers, said top surface of said first dielectric layer, and a part of said first dielectric layer within a first thickness of said top surface of said first dielectric layer so that no part of said first dielectric layer contacts said amorphous silicon plate;

annealing said amorphous silicon plate thereby forming hemispherical grain polysilicon on a surface of said amorphous silicon plate and forming a first capacitor plate;

depositing a conformal layer of second dielectric over a rough exterior surface of said amorphous silicon plate and a part of said first polysilicon stud not covered by said first dielectric layer;

depositing a layer of second polysilicon over said conformal layer of second dielectric; and patterning said conformal layer of second dielectric and said layer of second polysilicon thereby forming a second capacitor plate.

12. The method of claim 11 wherein said first dielectric layer is borophosphosilicate glass having a thickness of between about 3000 and 8000 Angstroms.

13. The method of claim 11 wherein said first dielectric layer is undoped silicon dioxide having a thickness of between about 3000 and 8000 Angstroms.

14. The method of claim 11 wherein said removing said part of said layer of first polysilicon above said top surface of said first dielectric layer is accomplished using plasma etchback.

15. The method of claim 11 wherein said removing said part of said layer of first polysilicon above said top surface of said first dielectric layer is accomplished using chemical mechanical polishing and said first dielectric layer is undoped silicon oxide having a thickness of between 3000 and 8000 Angstroms.

16. The method of claim 11 wherein said depositing said layer of amorphous silicon is accomplished using low pressure chemical vapor deposition of silane gas at a temperature of between about 540° C. and 560° C.

17. The method of claim 11 wherein said removing said top surface of said dielectric layer and said part of said first dielectric layer within said first thickness of said top surface of said first dielectric layer is accomplished by means of wet etching using hydrofluoric acid.

18. The method of claim 11 wherein said removing said top surface of said dielectric layer and said part of said first dielectric layer within said first thickness of said top surface of said first dielectric layer is accomplished by means of dry plasma etching using $CHF_3$.

19. The method of claim 11 wherein said annealing said amorphous silicon plate is performed at a temperature of between about 550° C. and 650° C. and a pressure of less than $1 \times 10^{-6}$ torr.

20. The method of claim 11 wherein said conformal layer of second dielectric is NO, ONO, or $Ta_2O_5$.

* * * * *